(12) United States Patent
Mori et al.

(10) Patent No.: US 6,985,362 B2
(45) Date of Patent: Jan. 10, 2006

(54) PRINTED CIRCUIT BOARD AND ELECTRONIC PACKAGE USING SAME

(75) Inventors: Hiroyuki Mori, Shiga-ken (JP); Yutaka Tsukada, Shiga-ken (JP); Kimihiro Yamanaka, Shiga-ken (JP)

(73) Assignee: International Business Machines Corporation, Armonk, NY (US)

( * ) Notice: Subject to any disclaimer, the term of this patent is extended or adjusted under 35 U.S.C. 154(b) by 262 days.

(21) Appl. No.: 09/947,125

(22) Filed: Sep. 5, 2001

(65) Prior Publication Data

US 2002/0007964 A1   Jan. 24, 2002

(30) Foreign Application Priority Data

Sep. 7, 2000   (JP)   ............................. 2000-271237

(51) Int. Cl.
   *H05K 7/02*   (2006.01)
(52) U.S. Cl. ...................... 361/760; 361/767; 174/255
(58) Field of Classification Search ............... 174/250, 174/254–261; 361/728–729, 735–736, 748–751, 361/760–765, 767, 780, 783, 794, 803, 807–810, 361/820; 438/106–108
   See application file for complete search history.

(56) References Cited

U.S. PATENT DOCUMENTS

| 5,233,504 A | * | 8/1993 | Melton et al. | ............... 361/760 |
| 5,435,732 A | * | 7/1995 | Angulas | ....................... 439/67 |
| 5,629,835 A | * | 5/1997 | Mahulikar et al. | ........... 361/719 |
| 5,764,119 A | * | 6/1998 | Miyagi et al. | ............... 333/238 |
| 5,784,261 A | * | 7/1998 | Pedder | ........................ 361/767 |
| 6,015,722 A | * | 1/2000 | Banks | ......................... 438/108 |
| 6,092,280 A | * | 7/2000 | Wojnarowski | ............... 29/829 |
| 6,254,971 B1 | * | 7/2001 | Katayose | ..................... 428/209 |
| 6,329,609 B1 | * | 12/2001 | Kaja et al. | .................. 174/262 |
| 2001/0013423 A1 | * | 8/2001 | Dalal | .......................... 174/260 |

* cited by examiner

Primary Examiner—Kamand Cuneo
Assistant Examiner—Thanh S Phan
(74) Attorney, Agent, or Firm—William N. Hogg (57) ABSTRACT

A printed circuit board on which a semiconductor chip is flip chip mounted, comprising a circuit pattern to which a conductive bump, provided in a corner portion of a semiconductor chip, is connected, an insulating layer for holding the circuit pattern, and a protection pad which is positioned on the insulating layer relative to the circuit pattern, to which the conductive bump is connected.

5 Claims, 7 Drawing Sheets

PRINTED CIRCUIT BOARD AND ELECTRONIC PACKAGE USING SAME

TECHNICAL FIELD

The present invention relates to a printed circuit board for mounting a semiconductor chip, including a structure having a protection pad positioned on a portion of the printed circuit board to substantially reduce stress concentration in an electrical connection between a circuit pattern of the printed circuit board and a conductive bump on a corner portion of the semiconductor chip.

BACKGROUND OF THE INVENTION

Flip chip mounting is a mounting method in which a conductive bump is provided on each electrode pad portion of a semiconductor chip. These conductive bumps are electrically connected to circuit patterns on the surface of a printed circuit board to form a flip chip electronic package.

These conductive bump and circuit patterns can be connected by means of a conductive paste-like adhesive containing fine silver particles. A conductive film interposer can be positioned between the conductive bumps and the circuit patterns. Heat and pressure can then be applied to the conductive film. Alternatively, a solder bump material placed between the conductive bumps and the circuit patterns can be reflowed to electrically connect the conductive bumps to the circuit patterns.

In the above-described flip chip package, the conductive bumps of the semiconductor chip and the circuit patterns on the printed circuit board are bonded together and electrically connected as a unit. Accordingly, when the printed circuit board having the semiconductor chip mounted thereon, is subjected to repeated temperature cycling (temperature rise and fall), a difference in a coefficient of thermal expansion (CTE) between the semiconductor chip and the printed circuit board can cause a stress, which concentrates on the electrical connections between the conductive bumps of the semiconductor chip and the circuit patterns. Repeated temperature cycling can cause an open circuit or a near open circuit and the electrical connection to fail, thus lowering the reliability of the flip chip package.

The above-described stress is concentrated particularly at a corner portion of the semiconductor chip. Moreover, in a built-up multi-layered printed circuit board in which the circuit patterns are constituted in a number of layers, the stress concentration can lead to damage, not only in the electrical connection between the conductive bump and the circuit pattern on the surface of the built-up multi-layered printed circuit board, but also to cracking and an exfoliation of an insulating layer within the built-up multi-layered printed circuit board. It is desirable to have an electronic package that significantly reduces the stresses concentrated at corner portions of the semiconductor chip in the package. The packages will have increased operational field life. The present invention is directed at overcoming the problems set forth above.

SUMMARY OF THE INVENTION

Accordingly, it is the object of this invention to enhance the art of packaging technology.

It is another object of this invention to provide a multi-layered printed circuit board adapted for having a semiconductor chip mounted thereon, that is part of an electronic package including a protection pad that substantially reduces stress concentration in an electrical connection between a circuit pattern on the printed circuit board and a conductive bump on a corner portion of the semiconductor chip.

According to one aspect of the invention, there is provided a printed circuit board adapted for having a semiconductor chip mounted thereon, the semiconductor chip including a conductive bump on a corner portion thereof, the circuit board comprising an insulating layer including a first surface, the first surface having first and second portions thereon, a circuit pattern positioned on the first portion of the first surface of the insulating layer and adapted for having an electrical connection thereon, for being electrically connected to the conductive bump on the corner portion of the semiconductor chip, and a protection pad positioned on the second portion of the first surface relative to the first portion so as to substantially reduce stress concentration in the electrical connection between the circuit pattern positioned on the first portion of the first surface of the insulating layer and the conductive bump of the semiconductor chip.

According to another aspect of the invention, there is provided a printed circuit board adapted for having a semiconductor chip mounted thereon, the semiconductor chip including a conductive bump on a corner portion thereof, the circuit board comprising an insulating layer including a first portion and a second portion positioned under the first portion, a circuit pattern positioned on the first portion of the insulating layer and adapted for having an electrical connection thereon, for being electrically connected to the conductive bump on the corner portion of the semiconductor chip, and a protection pad positioned on the second portion of the insulating layer so as to substantially reduce stress concentration in the electrical connection between the circuit pattern positioned on the first portion of the insulating layer and the conductive bump of the semiconductor chip.

According to yet another aspect of the invention, there is provided an electronic package comprising a printed circuit board having a first surface, the printed circuit board adapted for having a flip chip semiconductor mounted thereon, the flip chip semiconductor including a conductive bump on a corner portion thereof, an insulating layer positioned on the first surface of the printed circuit board, the insulating layer having first and second portions thereon, a circuit pattern positioned on the first portion of the insulating layer and adapted for having an electrical connection thereon, for being electrically connected to said conductive bump on the corner portion of the flip chip semiconductor; and a protection pad positioned on the second portion of the insulating layer relative to the first portion so as to substantially reduce stress concentration in the electrical connection between the circuit pattern positioned on the first portion of the insulating layer and the conductive bump of the flip chip semiconductor.

The invention is adaptable to mass production and will provide significant improvement in the ability to manufacture high reliability electronic packages, having a protection pad in the electronic package of which it is a part.

BRIEF DESCRIPTION OF THE DRAWINGS

FIGS. 6(*a*) and 6(*b*) are enlarged sectional views, in elevation, showing a method of mounting a flip chip semiconductor on the multi-layered printed circuit board of the present invention.

FIGS. 7(*a*) and 7(*b*) are enlarged sectional views, in elevation, showing another method of mounting a flip chip semiconductor on the multi-layered printed circuit board of the present invention.

DETAILED DESCRIPTION OF THE PREFERRED EMBODIMENTS

For a better understanding of the present invention together with other and further objects, advantages and capabilities thereof, reference is made to the following disclosure and appended claims in connection with the above referenced drawings.

Figure 1:
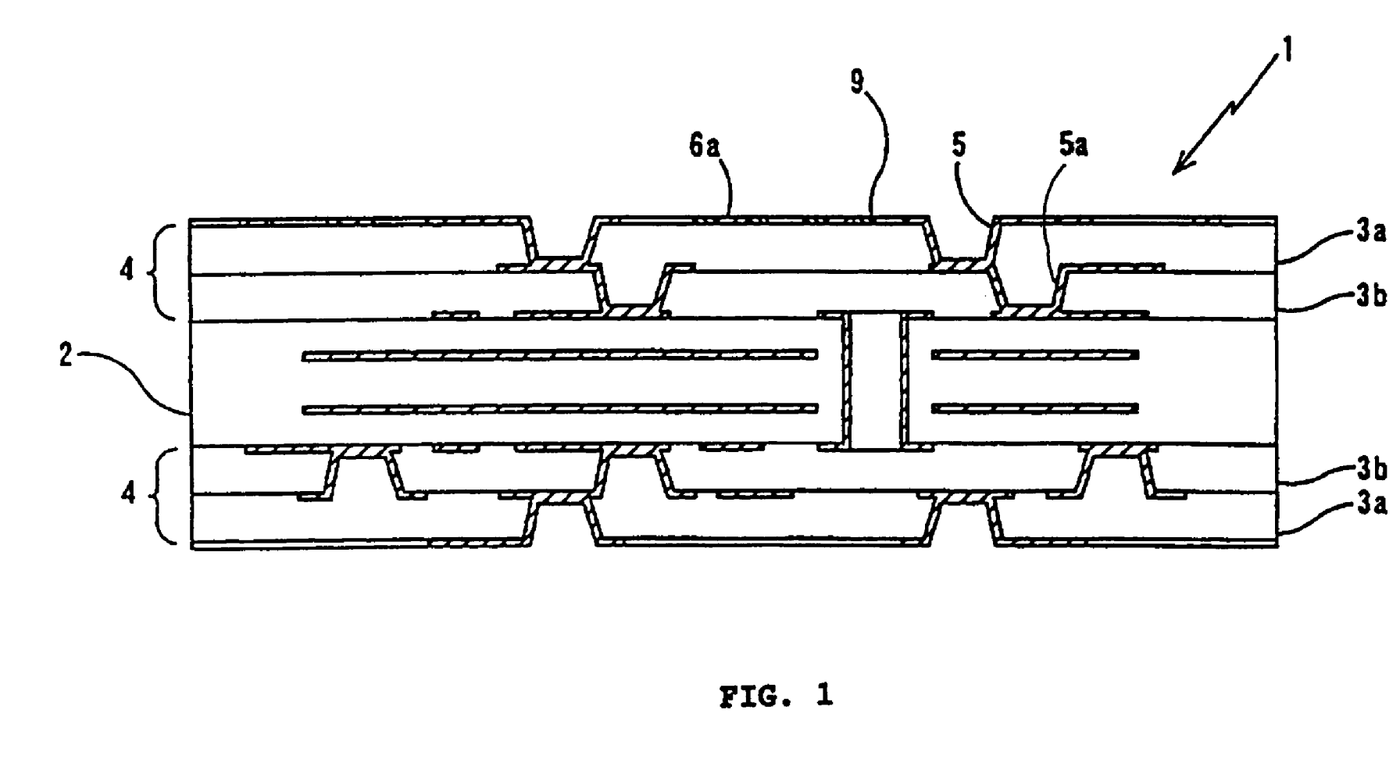
FIG. 1 is an enlarged sectional view, in elevation, showing an embodiment of the multilayered printed circuit board of the present invention.

Referring to FIG. 1, an enlarged sectional view, in elevation, of one embodiment of the multi-layered printed circuit board 1 of the present invention is shown. The multi-layered printed circuit board 1, a built-up structure as shown, comprises a base substrate 2 and built-up portions 4, applied on both sides of the base substrate, each of the built-up portions being formed of insulating resin layers 3*a* and 3*b*. In one built-up portion 4, a via hole 5 and a circuit pattern 6*a* are formed. The base substrate 2 can be formed as a multi-layered plate with multiple layers, which comprises, for example, a glass epoxy substrate. In the present invention, base substrate 2 can be comprised of any known substrate.

The insulating resin layers 3*a* and 3*b* on both sides of base substrate 2 can be formed in any acceptable manner, including the following: (1) pieces of metal foil with resin are laminated to the substrate, etched, drilled in a predetermined spot thereof by means of a YAG laser, a $CO_2$ laser and the like, and then plated; (2) thermosetting resin is coated onto the substrate, drilled in a predetermined spot by means of plasma, a YAG laser, a $CO_2$ laser and the like, and then plated; and (3) photosensitive resin is coated onto the substrate, exposed, developed to form a necessary pattern, and then plated.

In insulating resin layers 3*a* and 3*b*, via holes 5 and 5*a* are formed by the use of the above-described drilling method so as to make an electrical connection through the insulating layers. The two insulating layers 3*a* and 3*b* are laminated on each of both sides of base substrate 2. However, in the present invention, any number of insulating layers can be used depending on requirements.

A circuit pattern 6*a* is formed of a material such as copper deposited by, for example, an electroless plating method, on uppermost insulating layer 3*a*. On circuit pattern 6*a*, a semiconductor chip 7 (not shown) can be mounted by the flip chip mounting method. Moreover, FIG. 1 shows that a protection pad 9 is formed on the same surface as that of circuit pattern 6*a* to which the semiconductor chip can be mounted.

Figure 2:
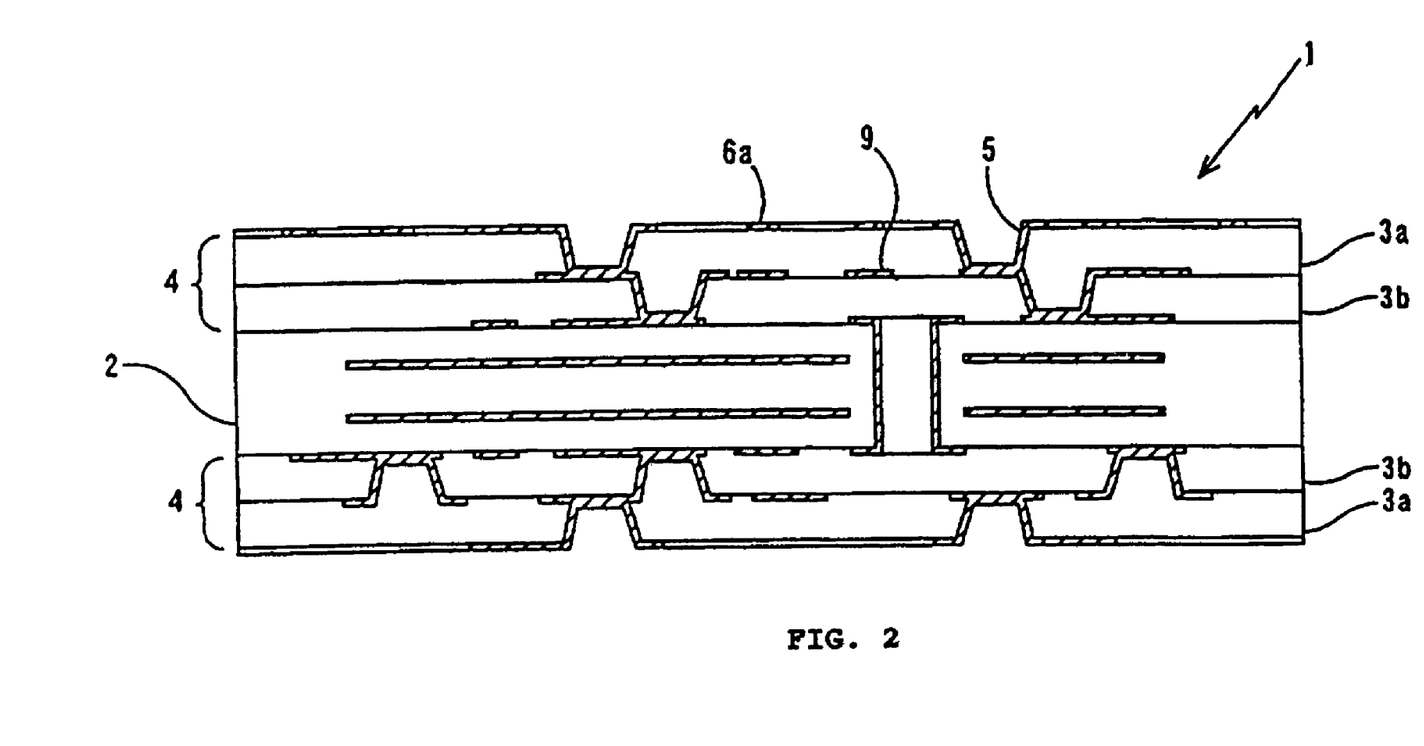
FIG. 2 is an enlarged sectional view, in elevation, showing another embodiment of the multi-layered printed circuit board of the present invention.

FIG. 2 shows another embodiment of a built-up multi-layered printed circuit board in which protection pad 9 is formed on insulating layer 3*b* below circuit pattern 6*a* where the semiconductor chip is to be mounted. FIGS. 1 and 2 show that protection pad 9 is formed only on one layer of insulating layers 3*a* and 3*b*. However, it is possible to form protection pad 9 relative to a circuit pattern corresponding to a semiconductor chip corner portion, for example, so as to oppose each other with insulating layer 3*a* interposed therebetween.

Figure 3:
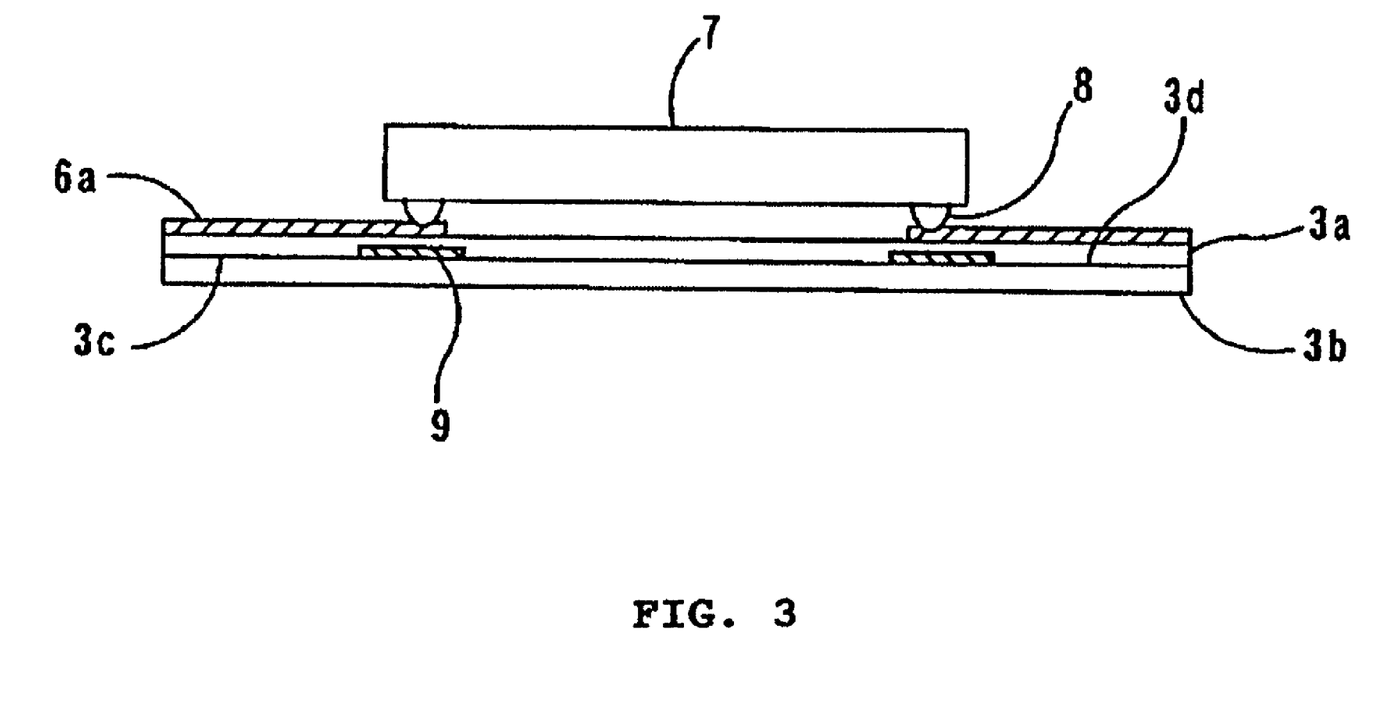
FIG. 3 is an enlarged partial sectional view, in elevation, showing a semiconductor chip mounting portion with a semiconductor chip positioned thereon, of the multi-layered printed circuit board shown in FIG. 2.

FIG. 3 shows a view in elevation and on a smaller scale than FIGS. 1 and 2, of semiconductor chip 7 mounted on a portion of the built-up multi-layered printed circuit board 1 of the embodiment shown in FIG. 2. On semiconductor chip 7, conductive bumps 8 are formed. These conductive bumps are comprised of a material such as gold, gold-plated metal or solder, for use in electrically connecting semiconductor chip 7 to circuit pattern 6*a* and affixing the semiconductor chip thereon. These conductive bumps 8 can be fixed on circuit pattern 6*a* by a paste-like conductive adhesive or reflowed solder, while making the electric connection thereof to semiconductor chip 7. In the present invention, a semiconductor bare chip (flip chip) or a semiconductor chip packaged in a chip scale package or chip size package (CSP), a ball grid array (BGA) package, a pin grind array (PGA) package or a wafer level CSP can be used to mount semiconductor chip 7 to multi-layered printed circuit board 1.

Protection pads 9 can be formed on a surface 3*c* of insulating layer 3*b* below circuit pattern 6*a* in the portion of the built-up multi-layered printed circuit board 1 of FIG. 3. These protection pads 9 are formed so as to respectively correspond to corner portions of semiconductor chip 7 below circuit pattern 6*a* to which conductive bumps 8 on corner portions of semiconductor chip 7 are electrically connected. In the present invention, it is possible to place protection pads 9 on any layer as long as these do not affect the circuit patterns. For example, in the present invention, in the case where the insulating resin layers 3*a* and 3*b* are not formed of thermosetting resin or photosensitive resin, but are formed of copper foil with resin, it is possible to form protective pads 9 on an opposite surface 3*d* to the side of the insulating layer 3*a* where the circuit pattern 6*a* is formed.

During operation of the electronic package, temperature rises and falls, and a stress is formed and concentrated on a connection portion between conductive bump 8 and circuit pattern 6*a*. This stress occurs due to a difference of the CTEs between semiconductor chip 7 and built-up multi-layered printed circuit board 1. The corner portion of semiconductor chip 7 shown in FIG. 3 is particularly prone to stress concentration. Accordingly, it is important to reduce the stress concentration, to improve reliability of the electric connection between conductive bump 8 and circuit pattern 6*a*, and to eliminate possible occurrence of crack damage such as within or on insulating layer 3*a*. Therefore, in the present invention, protection pad 9 is placed in a region, shown in FIG. 3, where stress is likely to concentrate. In particular, insulating layer 3*a* is restricted or stiffened by protection pad 9 in the vicinity of the corner portion of semiconductor chip 7. Thus, thermal expansion of the insulating layer 3*a* is locally reduced, and the stress concentration is lowered.

The above-described protection pad 9 can be formed by an electroless plating. Moreover, protection pad 9 can be also formed by adhering a copper foil with an adhesive film cut to a predetermined size onto a predetermined spot. The protection pad 9 can also be formed by a lamination process.

It is also possible to adjust the degree of the stress relief by the use of a protection pad having a different thickness from that of circuit pattern 6a.

Figure 4:
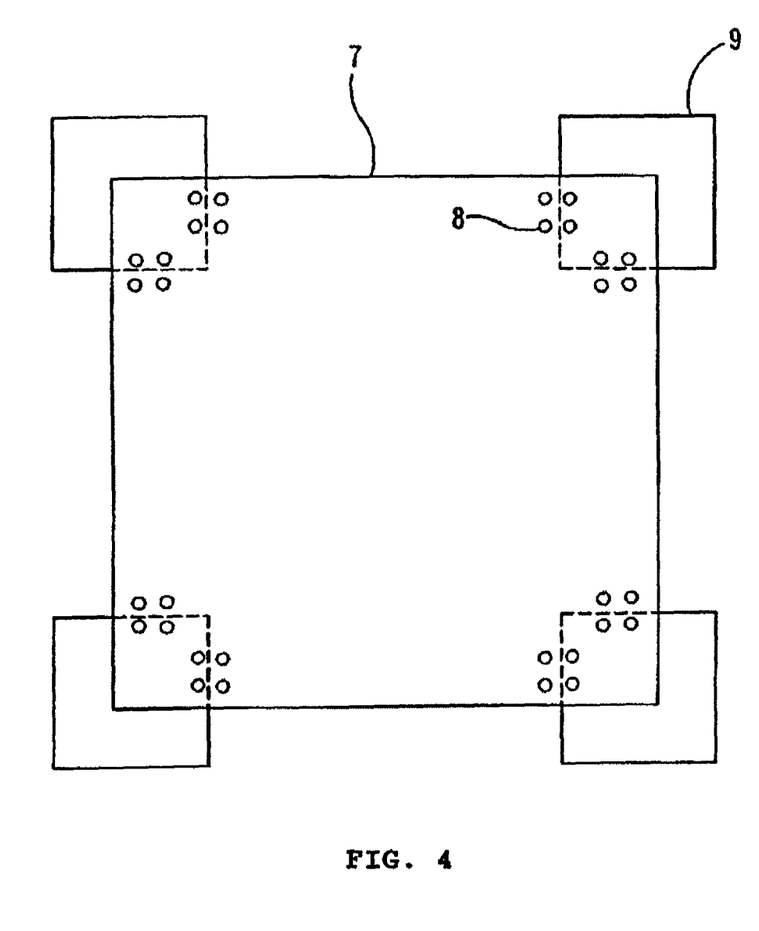
FIG. 4 is a top plan view showing an embodiment including a plurality of protection pads in a semiconductor chip mounting portion of the multi-layered printed circuit board of the present invention.

FIG. 4 is a much enlarged plan view of the embodiment of the multi-layer printed circuit board of FIG. 1, showing placement of semiconductor chip 7, conductive bumps 8 and protection pads 9, which are mounted on the built-up multi-layered printed circuit board 1 (not shown). Portions of protection pads 9, which are placed below semiconductor chip 7, are shown by dotted lines. Each of the protection pads 9 of the present invention is substantially rectangular; however, the shape of the protection pads 9 is not limited to a rectangular shape, and any appropriate shape can be adopted. Moreover, the size and thickness of protection pads 9 for use in the present invention are not necessarily limited to those shown in FIG. 4. Any size and thickness can be adopted as long as the protection pads 9 are placed relative to corner portion of semiconductor chip 7 and do not interfere with circuit patterns.

Figure 5:
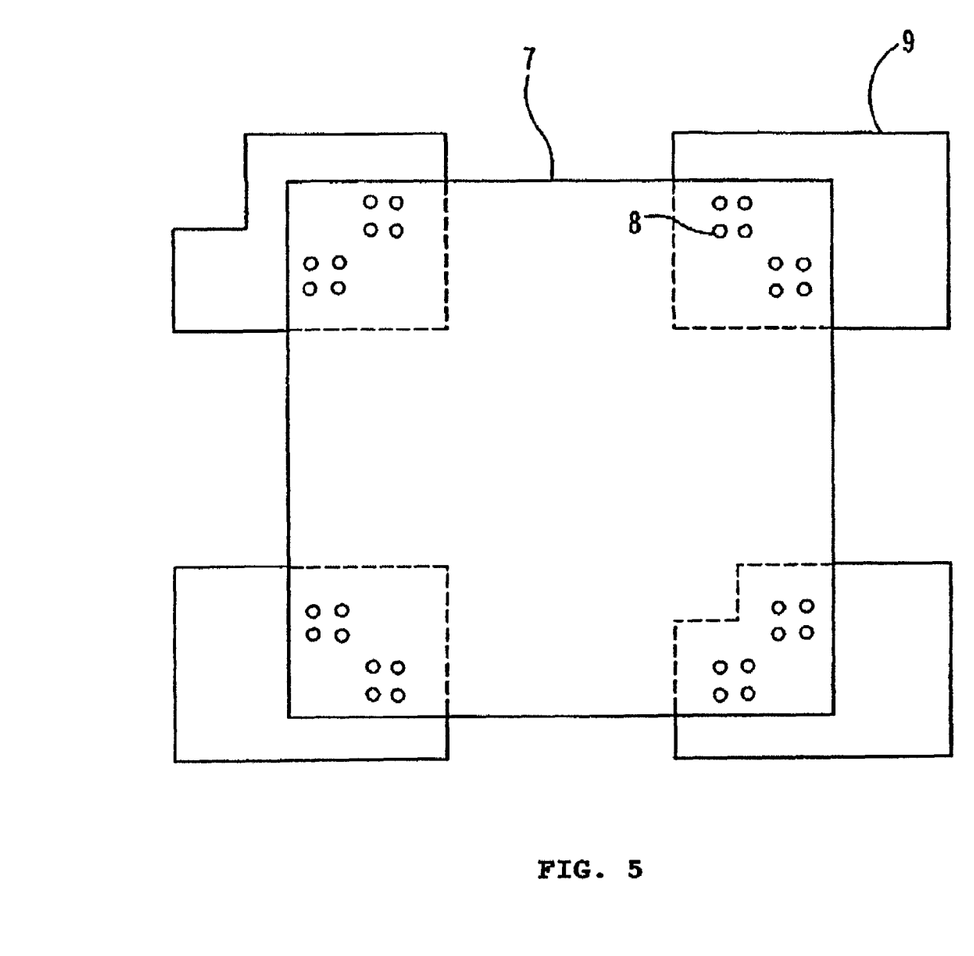
FIG. 5 is a top plan view showing another embodiment including a plurality of protection pads in a semiconductor chip mounting portion of the multi-layered printed circuit board of the present invention.

FIG. 5 is a plan view showing the embodiment of the multi-layer printed circuit board of FIG. 2 where semiconductor chip 7 is flip chip mounted on the built-up multi-layered printed circuit board 1 (not shown). In this view, protection pads 9 are formed so as to be under the shadow of conductive bumps 8 positioned respectively on corner portions of semiconductor chip 7. Moreover, the shapes of protection pads 9 may not be the same, and can be formed into shapes different from one another. As shown in the above-described embodiments of FIGS. 4 and 5, protection pads 9 can be formed in a size and location as long as these do not affect any of the circuit patterns.

Figure 6:
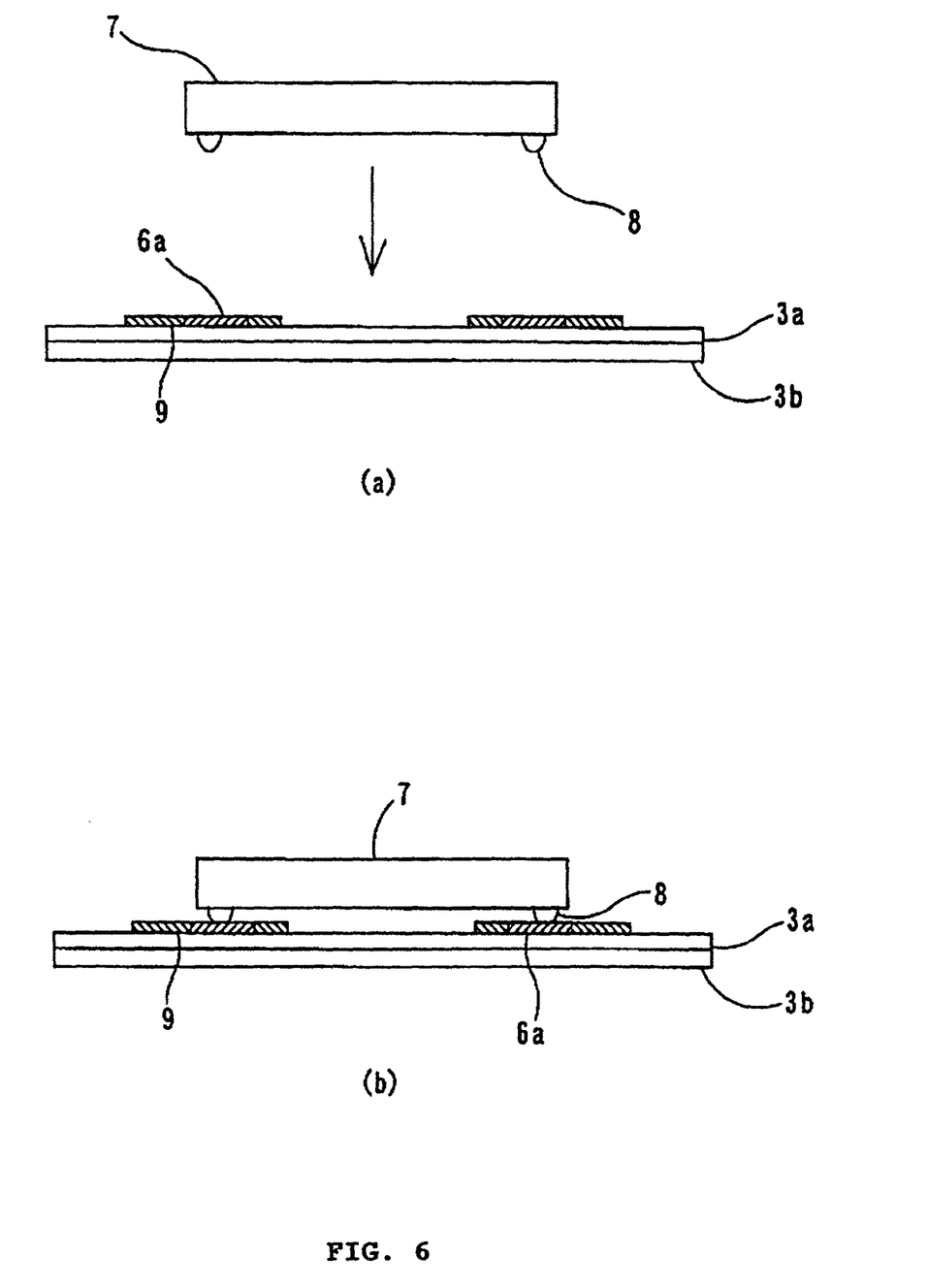

Referring to FIGS. 6(a) and 6(b), a method of making the multi-layered printed circuit board using a flip chip mounting method is shown. In FIG. 6(a), semiconductor chip 7 is placed on circuit pattern 6a of which portions corresponding to chip corner portions are protected by protection pads 9. The conductive bumps 8 of semiconductor chip 7 are formed of solder material. In FIG. 6(b), conductive bumps 8 are connected to the circuit pattern 6a, and then the solder is reflowed. Thus, conductive bumps 8 of semiconductor chip 7 and circuit patterns 6a are connected, respectively, by flip chip bonds. The portions of circuit patterns 6a corresponding to the chip corner portions of semiconductor chip 7 are protected in wide areas by protection pads 9. Accordingly, stress concentration can be effectively relieved, and resin cracking can be prevented.

Figure 7:
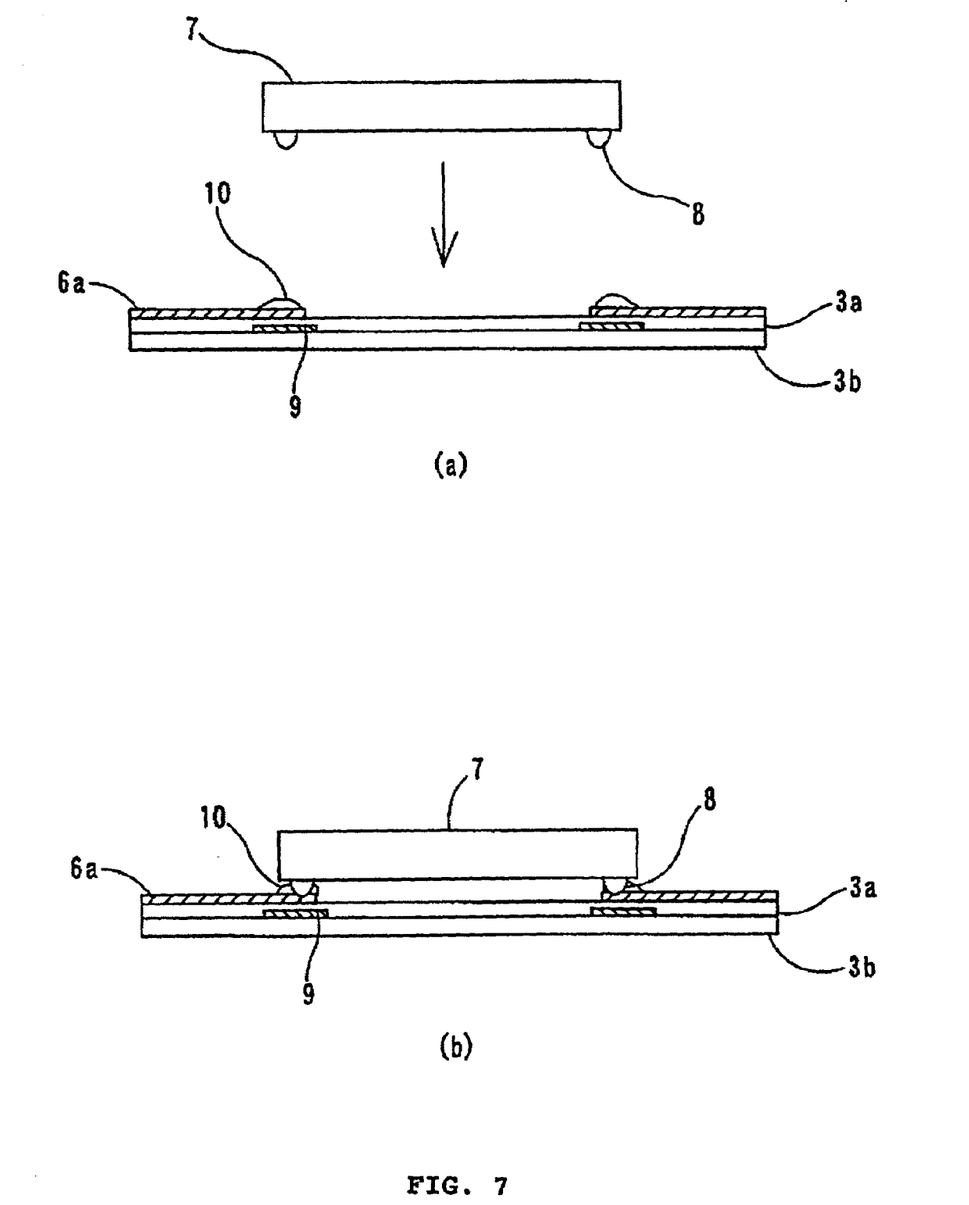

FIGS. 7(a) and 7(b) show another embodiment of the flip chip mounting method of the present invention. Referring to FIG. 7(a), paste-like conductive adhesive 10 is adhered to the portion of the built-up multi-layered printed circuit board, on which semiconductor chip 7 is to be mounted. Next, as shown in FIG. 7(b), semiconductor chip 7 is placed on circuit pattern 6a to connect conductive bumps 8 to conductive adhesive 10. The protection pads 9 are formed on insulating layers 3a or 3b as described above according to the forming method of the built-up multi-layered printed circuit board. Thereafter, conductive adhesive 10 is substantially cured by such means as heating, thereby affixing semiconductor chip 7 to circuit pattern 6a. Pressure can be applied to semiconductor chip 7 to assist in the cure of conductive adhesive 10, thus further securing the electrical connection. Alternatively, the adhesion can be secured by the steps of partially curing the adhesive followed by substantially curing the adhesive.

The printed circuit board of the present invention can accommodate semiconductor chip 7 packaged by flip chip bonding to a CSP, PGA and BGA package. For example, when semiconductor chip 7 is packaged in a CSP, a member such as an interposer can be positioned between circuit pattern 6a and the semiconductor chip (such as an Large Scale Integrated chip). In such a manner, the present invention can be used to connect the interposer to circuit pattern 6a. When highly dense mounting is required, a semiconductor chip can be directly attached to circuit When highly dense mounting is required, a semiconductor chip can be directly attached to circuit pattern 6a.

Description has been made above for the present invention based on the embodiments shown in the drawings. However, the present invention is not limited to the above-described embodiments, and the present invention can be applied to substantially any situation where flip chip mounting is performed to connect the semiconductor chip to the printed circuit board. Moreover, although the printed circuit board of the present invention has been described with the built-up multi-layered printed circuit board using a conformal via system as an example, the present invention can also be applied to a printed circuit board formed by other methods including that of a transfer-buildup printed circuit board and of a conductive paste connection-buildup printed circuit board. Furthermore, the present invention can be applied to substantially any connection method between a semiconductor chip and the circuit pattern.

Although the preferred embodiments of the present invention have been described in detail, it should be understood that various changes, substitutions and alternations can be made therein without departing from spirit and scope of the inventions as defined by the appended claims.

What is claimed is:

1. A printed circuit board adapted for having a semiconductor chip directly mounted thereon, said semiconductor chip including a conductive bump on a corner portion thereof, said circuit board comprising:
    an insulating layer including a first surface, said first surface having first and second portions thereon;
    a circuit pattern positioned on said first portion of said first surface of said insulating layer and adapted for having an electrical connection thereon, for being directly electrically connected to said conductive bump on said corner portion of said semiconductor chip; and
    a protection pad positioned on said second portion of said first surface relative to said first portion so as to substantially reduce stress concentration in said electrical connection between said circuit pattern positioned on said first portion of said first surface of said insulating layer and said conductive bump of said semiconductor chip.

2. The printed circuit board according to claim 1, wherein said printed circuit board comprises a built-up multi-layered printed circuit board.

3. The printed circuit board according to claim 1, wherein said protection pad comprises plated copper or copper foil.

4. The printed circuit board according to claim 1, wherein said semiconductor chip comprises a part of a CSP, BGA, or BGA.

5. The printed circuit board according to claim 1, wherein said semiconductor chip comprises a flip chip semiconductor.

* * * * *

UNITED STATES PATENT AND TRADEMARK OFFICE
CERTIFICATE OF CORRECTION

PATENT NO. : 6,985,362 B2
DATED : January 10, 2006
INVENTOR(S) : Mori et al.

It is certified that error appears in the above-identified patent and that said Letters Patent is hereby corrected as shown below:

Column 6,
Line 61, the term -- PGA -- should be inserted and the term "BGA" deleted.

Signed and Sealed this

Twenty-eighth Day of March, 2006

JON W. DUDAS
*Director of the United States Patent and Trademark Office*